United States Patent
Yi

(10) Patent No.: US 12,389,682 B2
(45) Date of Patent: Aug. 12, 2025

(54) DISPLAY PANEL AND METHOD FOR FABRICATING THE SAME

(71) Applicant: WUHAN CHINA STAR OPTOELECTRONICS SEMICONDUCTOR DISPLAY TECHNOLOGY CO., LTD., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/597,104

(22) PCT Filed: Dec. 16, 2021

(86) PCT No.: PCT/CN2021/138936
§ 371 (c)(1),
(2) Date: Dec. 27, 2021

(87) PCT Pub. No.: WO2023/103024
PCT Pub. Date: Jun. 15, 2023

(65) Prior Publication Data
US 2024/0038778 A1  Feb. 1, 2024

(30) Foreign Application Priority Data
Dec. 11, 2021 (CN) .......................... 202111510741.0

(51) Int. Cl.
*H10D 86/60* (2025.01)
*H01L 25/075* (2006.01)
(Continued)

(52) U.S. Cl.
CPC ......... *H10D 86/60* (2025.01); *H01L 25/0753* (2013.01); *H01L 25/167* (2013.01); *H10D 86/443* (2025.01); *H10H 20/857* (2025.01)

(58) Field of Classification Search
CPC ..... H01L 33/00–648; H01L 27/15–156; H01L 2933/00–0091
See application file for complete search history.

(56) References Cited

U.S. PATENT DOCUMENTS

2007/0105286 A1   5/2007  Huh et al.
2015/0001476 A1   1/2015  Wang
(Continued)

FOREIGN PATENT DOCUMENTS

CN   107425041 A   12/2017
CN   109273479 A   1/2019
(Continued)

OTHER PUBLICATIONS

Chinese Office Action issued in corresponding Chinese Patent Application No. 202111510741.0 dated May 14, 2023, pp. 1-7.
(Continued)

*Primary Examiner* — Matthew C Landau
*Assistant Examiner* — Nora T. Nix

(57) ABSTRACT

A display panel and a method for fabricating the same are disclosed. The display panel includes a base substrate, a micro-light emitting device layer and a thin film transistor array layer. The micro-light emitting device layer is disposed on one side of the base substrate, a light output side faces to the base substrate, and the thin film transistor array layer is formed on the side of the micro-light emitting device layer facing away from the light output side. LED chips do not need to be bound and connected to the thin film transistor array layer through a conductive adhesive bonding process (Continued)

or a metal bonding process during mass transfer, so that the stability and yield are improved.

10 Claims, 8 Drawing Sheets

(51) Int. Cl.
*H01L 25/16* (2023.01)
*H10D 86/40* (2025.01)
*H10H 20/857* (2025.01)

(56) References Cited

U.S. PATENT DOCUMENTS

| | | | | |
|---|---|---|---|---|
| 2015/0028362 | A1* | 1/2015 | Chan | H01L 24/29 438/28 |
| 2018/0269087 | A1* | 9/2018 | Wu | H01L 21/67144 |
| 2019/0355799 | A1* | 11/2019 | Jeong | H10K 59/124 |
| 2022/0020907 | A1* | 1/2022 | Yuan | H10D 30/6723 |
| 2022/0139888 | A1* | 5/2022 | Kim | G09G 3/20 257/89 |
| 2023/0215907 | A1* | 7/2023 | Akimoto | H10H 29/142 257/72 |

FOREIGN PATENT DOCUMENTS

| | | |
|---|---|---|
| CN | 109991779 A | 7/2019 |
| CN | 110137184 A | 8/2019 |
| CN | 111244129 A | 6/2020 |
| CN | 111293135 A | 6/2020 |
| CN | 111341814 A | 6/2020 |
| CN | 210837757 U | 6/2020 |
| CN | 111415969 A | 7/2020 |
| CN | 112310116 A | 2/2021 |
| CN | 112382643 A | 2/2021 |
| CN | 113270467 A | 8/2021 |
| CN | 114188466 A | 3/2022 |
| IN | 112558354 A | 3/2021 |

OTHER PUBLICATIONS

International Search Report in International application No. PCT/CN2021/138936,mailed on Apr. 27, 2022.
Written Opinion of the International Search Authority in International application No. PCT/CN2021/138936, mailed on Apr. 27, 2022.
Chinese Office Action issued in corresponding Chinese Patent Application No. 202111510741.0 dated Jan. 18, 2023, pp. 1-7.

* cited by examiner

DISPLAY PANEL AND METHOD FOR FABRICATING THE SAME

BACKGROUND

Technical Field

This application relates to the technical field of display, in particular to a display panel and a method for fabricating the same.

Related Art

Existing micro-light emitting diode (micro-LED) display panels usually adopt the following fabrication process: firstly, fabricating a driving base substrate; then, transferring LED chips on a wafer to the driving base substrate through a mass transfer process; and then, performing a module process. The mass transfer process usually used is an anisotropic conductive adhesive binding process or a metal binding process, the process is relatively more difficult, the bonding strength between the LED chip and the driving base substrate is low, and under the action of external force, the bonding between the LED chip and the driving base substrate is easily destroyed, resulting in poor stability and low yield of LED chips.

SUMMARY

Technical Problem

The embodiment of this application provides a display panel and a method for fabricating the same, so as to solve the technical problems of poor stability and low yield caused by the low bonding strength between the LED chip and the driving base substrate in the existing display panel and method for fabricating the same.

Technical Solution

To resolve the foregoing problem, the technical solutions provided in this application are as follows:

The present application provides a display panel, comprising:
  a base substrate, the base substrate being a glass substrate or a transparent polyimide substrate;
  a micro-light emitting device layer, disposed on one side of the base substrate, a light output side of the micro-light emitting device layer facing the base substrate; and
  a thin film transistor array layer, formed on the side of the micro-light emitting device layer facing away from the light output side, wherein
  the micro-light emitting device layer comprises a plurality of LED chips, and the thin film transistor array layer is electrically connected to the LED chips to drive the LED chips to emit light.

According to the display panel provided by this application, the LED chip comprises a light emitting module, and a first electrode and a second electrode disposed on the side of the light emitting module away from the base substrate; the micro-light emitting device layer further comprises a first insulating layer, the first insulating layer covers the base substrate and the LED chips, the thin film transistor array layer is electrically connected to the first electrode through a first via passing through the first insulating layer, and the thin film transistor array layer is electrically connected to the second electrode through a second via passing through the first insulating layer.

According to the display panel provided by this application, the thin film transistor array layer comprises:
  a metal wiring layer, located on the side of the first insulating layer away from the base substrate, the metal wiring layer being electrically connected to the first electrode through the first via, and the metal wiring layer being electrically connected to the second electrode through the second via;
  a second insulating layer, covering the first insulating layer and the metal wiring layer; and
  a driving function layer, located on the side of the second insulating layer away from the base substrate, the driving function layer being electrically connected to the metal wiring layer through a third via passing through the second insulating layer.

According to the display panel provided by this application, the driving function layer comprises:
  a third insulating layer, located on the side of the second insulating layer away from the base substrate;
  a semiconductor layer, located on the side of the third insulating layer away from the base substrate;
  a first gate insulating layer, covering the third insulating layer and the semiconductor layer;
  a first gate layer, located on the side of the first gate insulating layer away from the base substrate;
  a second gate insulating layer, covering the first gate layer and the first gate insulating layer;
  a second gate layer, located on the side of the first gate insulating layer away from the base substrate;
  an interlayer dielectric layer, covering the second gate layer and the second gate insulating layer;
  a first source and drain metal layer, located on the side of the interlayer dielectric layer away from the base substrate, the first source and drain metal layer comprising a source, a drain and a signal wiring, and the signal wiring being electrically connected to the metal wiring layer through a fourth via passing through the interlayer dielectric layer, the second gate insulating layer, the first gate insulating layer and the third insulating layer, the fourth via being communicated to the third via; and
  a first planarization layer, covering the interlayer dielectric layer and the first source and drain metal layer.

According to the display panel provided by this application, the display panel comprises a plurality of island regions and a plurality of hinge regions separated from each other, wherein each hinge region is located between adjacent two island regions for connecting the adjacent two island regions, and each LED chip is located in the corresponding island region; and
  a fifth via is disposed in the hinge region, the fifth via passes through the driving function layer, and an organic filling layer is disposed in the fifth via.

According to the display panel provided by this application, a sixth via is disposed in the hinge region and the sixth via passes through the thin film transistor array layer and the micro-light emitting device layer.

According to the display panel provided by this application, a connection wiring part is disposed in the hinge region and the connection wiring part extends from the island region to the hinge region through the first source and drain metal layer.

According to the display panel provided by this application, the display panel further comprises a stretchable board, the stretchable board is disposed on the side of the thin film transistor array layer away from the base substrate, and/or the stretchable board is disposed on the side of the micro-light emitting device layer away from the thin film transistor array layer.

According to the display panel provided by this application, a material of the stretchable board comprises polydimethylsiloxane (PDMS).

The present application provides a display panel, comprising:
  a base substrate;
  a micro-light emitting device layer, disposed on one side of the base substrate, a light output side of the micro-light emitting device layer facing the base substrate; and
  a thin film transistor array layer, formed on the light output side of the micro-light emitting device layer, wherein the micro-light emitting device layer comprises a plurality of LED chips, and
  the thin film transistor array layer is electrically connected to the LED chips to drive the LED chips to emit light.

According to the display panel provided by this application, the LED chip comprises a light emitting module, and a first electrode and a second electrode disposed on the side of the light emitting module away from the base substrate;
  the micro-light emitting device layer further comprises a first insulating layer,
  the first insulating layer covers the base substrate and the LED chips, the thin film transistor array layer is electrically connected to the first electrode through a first via passing through the first insulating layer, and the thin film transistor array layer is electrically connected to the second electrode through a second via passing through the first insulating layer.

According to the display panel provided by this application, the thin film
  transistor array layer comprises:
    a metal wiring layer, located on the side of the first insulating layer away from the base substrate, the metal wiring layer being electrically connected to the first electrode through the first via, and the metal wiring layer being electrically connected to the second electrode through the second via;
    a second insulating layer, covering the first insulating layer and the metal wiring layer; and
    a driving function layer, located on the side of the second insulating layer away from the base substrate, the driving function layer being electrically connected to the metal wiring layer through a third via passing through the second insulating layer.

According to the display panel provided by this application, the driving function layer comprises:
    a third insulating layer, located on the side of the second insulating layer away from the base substrate;
    a semiconductor layer, located on the side of the third insulating layer away from the base substrate;
    a first gate insulating layer, covering the third insulating layer and the semiconductor layer;
    a first gate layer, located on the side of the first gate insulating layer away from the base substrate;
    a second gate insulating layer, covering the first gate layer and the first gate insulating layer;
    a second gate layer, located on the side of the first gate insulating layer away from the base substrate;
    an interlayer dielectric layer, covering the second gate layer and the second gate insulating layer;
    a first source and drain metal layer, located on the side of the interlayer dielectric layer away from the base substrate, the first source and drain metal layer comprising a source, a drain and a signal wiring, and the signal wiring being electrically connected to the metal wiring layer through a fourth via passing through the interlayer dielectric layer, the second gate insulating layer, the first gate insulating layer and the third insulating layer, the fourth via being communicated to the third via; and
    a first planarization layer, covering the interlayer dielectric layer and the first source and drain metal layer.

According to the display panel provided by this application, the display panel comprises a plurality of island regions and a plurality of hinge regions separated from each other, wherein each hinge region is located between adjacent two island regions for connecting the adjacent two island regions, and each LED chip is located in the corresponding island region; and
    a fifth via is disposed in the hinge region, the fifth via passes through the driving function layer, and an organic filling layer is disposed in the fifth via.

According to the display panel provided by this application, a sixth via is disposed in the hinge region and the sixth via passes through the thin film transistor array layer and the micro-light emitting device layer.

According to the display panel provided by this application, a connection wiring part is disposed in the hinge region and the connection wiring part extends from the island region to the hinge region through the first source and drain metal layer.

According to the display panel provided by this application, the display panel further comprises a stretchable board, the stretchable board is disposed on the side of the thin film transistor array layer away from the base substrate, and/or the stretchable board is disposed on the side of the micro-light emitting device layer away from the thin film transistor array layer.

According to the display panel provided by this application, a material of the stretchable board comprises polydimethylsiloxane (PDMS).

This application provides a method for fabricating a display panel, comprising the following steps:
    providing a base substrate;
    mass-transferring a plurality of LED chips to one side of the base substrate to form a micro-light emitting device layer, wherein a light output side of the micro-light emitting device layer faces the base substrate; and
    forming a thin film transistor array layer on the side of the micro-light emitting device layer facing away from the light output side, and electrically connecting the thin film transistor array layer to the LED chips.

According to the method for fabricating the display panel provided by this application, after the step of mass-transferring a plurality of LED chips to one side of the base substrate, the method further comprises the following step:
    detecting the plurality of LED chips, determining whether there is a faulty LED chip, and if so, repairing the faulty LED chip.

Beneficial Effects

This application has the following beneficial effects: by forming the thin film transistor array layer on the side of the micro-light emitting device layer facing away from the light output side after mass-transferring the LED chips in the micro-light emitting device layer to the base substrate, compared with the related art, since the thin film transistor array layer is directly formed on the LED chips after mass transfer of the LED chips, the LED chips do not need to be bound and connected to the thin film transistor array layer through an anisotropic conductive adhesive binding process or a metal binding process, thus making the LED chips be firmly bonded to the thin film transistor array layer, which is beneficial to improving the stability and yield of the LED chips, and reducing the process difficulty.

BRIEF DESCRIPTION OF THE DRAWINGS

To describe the technical solutions in the embodiments of this application more clearly, the following briefly describes the accompanying drawings required for describing the embodiments. Apparently, the accompanying drawings in the following description show merely some embodiments of this application, and a person skilled in the art may still derive other drawings from these accompanying drawings without creative efforts.

DESCRIPTION OF SYMBOLS

1—base substrate; 2—micro-light emitting device layer; 3—thin film transistor array layer; 4—fourth insulating layer; 5—stretchable board;
20—LED chip; 21—first insulating layer; 211—first via; 212—second via; 201—light emitting module; 202—first electrode; 203—second electrode;
30—metal wiring layer; 31—second insulating layer; 311—third via; 32—driving function layer; 321—third insulating layer; 322—semiconductor layer; 323—first gate insulating layer; 324—first gate layer; 325—second gate insulating layer; 326—second gate layer; 327—interlayer dielectric layer; 328—first source and drain metal layer; 3281—source; 3282—drain; 3283—signal wiring; 3284—fourth via; 3285—fifth via; 329—first planarization layer; 3210—second source and drain metal layer; 32101—sixth via; 3211—second planarization layer; 3212—organic filling layer;
100a—island region; 100b—hinge region; and 101—connection wiring part.

DETAILED DESCRIPTION

The technical solutions of embodiments of the present application are clearly and completely described below with reference to the accompanying drawings in embodiments of the present application. Apparently, the described embodiments are merely a part rather than all of the embodiments of the present application. All other embodiments obtained by a person skilled in the art based on the embodiments of the present application without creative efforts shall fall within the protection scope of the present application. It should be understood that the specific implementations described herein are merely for illustrating and explaining the present application and are not intended to limit the present application. In the present application, unless otherwise specified, orientation terms such as "up" and "down" generally refer to the up and down of a device in an actual use or a working state, and specifically, refer to graphical directions of the accompanying drawings; and "inside" and "outside" refer to the inside and outside relative to the contour of the device.

Figure 1:
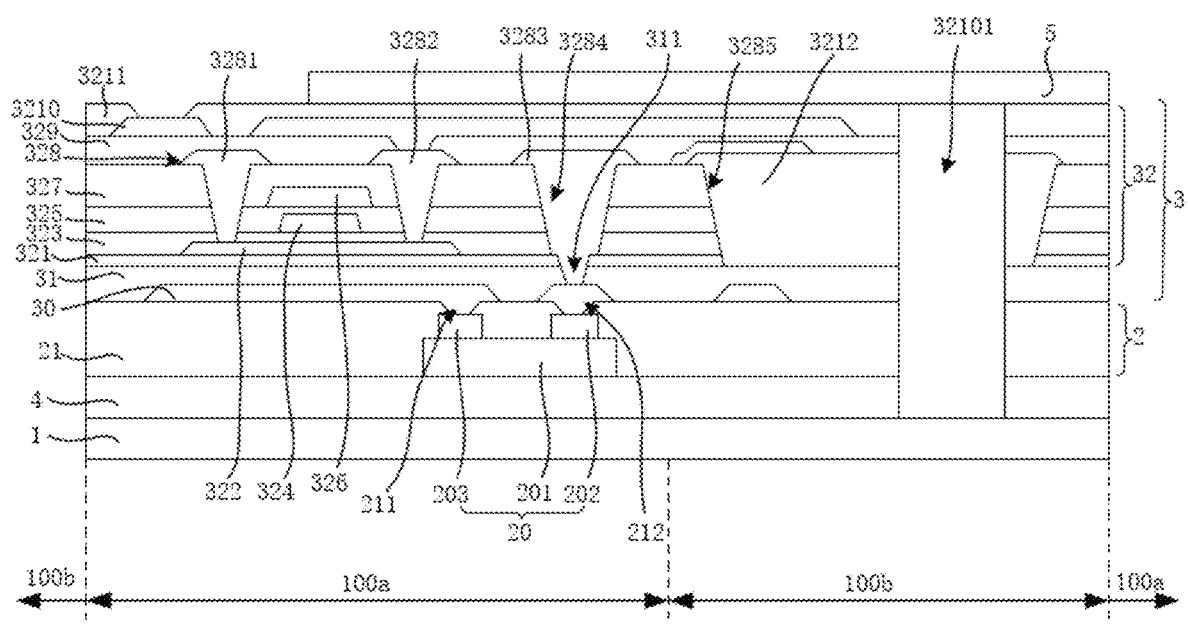
FIG. 1 illustrates a schematic sectional structural diagram of a display panel provided by an embodiment of this application.

Referring to FIG. 1. FIG. 1 is a schematic sectional structural diagram of a display panel provided by an embodiment of this application. The embodiment of this application provides a display panel. The display panel includes a base substrate 1, a micro-light emitting device layer 2 and a thin film transistor array layer 3. The micro-light emitting device layer 2 is disposed on one side of the base substrate 1. A light output side of the micro-light emitting device layer 2 faces the base substrate 1. The thin film transistor array layer 3 is formed on the side of the micro-light emitting device layer 2 facing away from the light output side. The micro-light emitting device layer 2 includes a plurality of LED chips 20. The thin film transistor array layer 3 is electrically connected to the LED chips 20 to drive the LED chips 20 to emit light.

It can be understood that this application designs a new display panel architecture. The micro-light emitting device layer 2 and the thin film transistor array layer 3 are successively disposed on the side of the base substrate 1 facing away from the light output side. Compared with the related art, in which the thin film transistor array layer 3 and the micro-light emitting device layer 2 are successively disposed on the light output side of the base substrate 1, the thin film transistor array layer 3 is located on the side of the micro-light emitting device layer 2 facing away from the base substrate 1, in this application, before forming the thin film transistor array layer 3, the LED chips 20 can be mass-transferred to the side of the base substrate 1 facing away from the light output side first, and then the thin film transistor array layer 3 is directly formed on the side of the micro-light emitting device layer 2 away from the base substrate 1. Compared with the related art, since the thin film transistor array layer 3 is directly formed on the micro-light emitting device layer 2, the LED chips 20 do not need to be bound and connected to the thin film transistor array layer 3 through an anisotropic conductive adhesive binding process or a metal binding process during mass transfer, thus making the LED chips 20 be firmly bonded to the thin film transistor array layer 3, which is beneficial to improving the stability and yield of the LED chips 20, and reducing the process difficulty.

Optionally, the base substrate 1 is a transparent substrate, and the base substrate 1 is a rigid base substrate or a flexible base substrate. For example, the base substrate 1 may be a glass substrate or a transparent polyimide substrate.

Specifically, the LED chip 20 includes a light emitting module 201, and a first electrode 202 and a second electrode 203 disposed on the side of the light emitting module 201 away from the base substrate 1. The first electrode 202 may be one of a P electrode and an N electrode, and the second electrode 203 may be the other of a P electrode and an N electrode. In this embodiment of this application, the first electrode 202 is a P electrode, and the second electrode 203 is an N electrode.

Specifically, the micro-light emitting device layer 2 further includes a first insulating layer 21. The first insulating layer 21 covers the base substrate 1 and the LED chip 20. The thin film transistor array layer 3 is electrically connected to the first electrode 202 through a first via 211 passing through the first insulating layer 21. The thin film transistor array layer 3 includes a plurality of thin film transistors distributed in an array. Each thin film transistor is electrically connected to the second electrode 203 through a second via 212 passing through the first insulating layer 21 to drive the corresponding light emitting module 201 to emit light.

While planarizing the micro-light emitting device layer 2, the first insulating layer 21 can package the LED chip 20 without adopting an additional packaging process, thus effectively reducing the production cost.

Optionally, the first insulating layer 21 may be single-layer or multilayer. The material of the first insulating layer 21 may be an inorganic material or an organic material. For example, the inorganic material includes an oxide of silicon or a nitride of silicon or a multilayer film structure, and the organic material includes polyimide.

Specifically, a thickness of the first insulating layer 21 is in a range of 1 micron to 30 microns.

Specifically, the thin film transistor array layer 3 includes a metal wiring layer a second insulating layer 31 and a driving function layer 32. The metal wiring layer 30 is located on the side of the first insulating layer 21 away from the base substrate 1. The metal wiring layer 30 is electrically connected to the first electrode 202 through the first via 211. The metal wiring layer 30 is electrically connected to the second electrode 203 through the second via 212. The second insulating layer 31 covers the first insulating layer 21 and the metal wiring layer 30 for planarizing the metal wiring layer 30. The driving function layer 32 is located on the side of the second insulating layer 31 away from the base substrate 1. The driving function layer 32 is electrically connected to the metal wiring layer 30 through a third via 311 passing through the second insulating layer 31.

Specifically, the metal wiring layer 30 includes an anode wiring and a low potential power signal line disposed at an interval. The anode wiring is electrically connected to the first electrode 202 through the first via 211. The low potential power signal line is electrically connected to the second electrode 203 through the second via 212.

Specifically, the driving function layer 32 includes a third insulating layer 321, a semiconductor layer 322, a first gate insulating layer 323, a first gate layer 324, a second gate insulating layer 325, a second gate layer 326, an interlayer dielectric layer 327, a first source and drain metal layer 328, and a first planarization layer 329. The third insulating layer 321 is located on the side of the second insulating layer 31 away from the base substrate 1. A material of the third insulating layer 321 may be an inorganic material, for preventing external water vapor from invading the driving function layer 32 and thus preventing the driving function layer 32 from being disturbed by water vapor. The semiconductor layer 322 is located on the side of the third insulating layer 321 away from the base substrate 1. A material of the semiconductor layer 322 includes at least one of indium gallium zinc oxide (IGZO), indium gallium titanium oxide (IZTO) and indium gallium zinc titanium oxide (IGZTO). The first gate insulating layer 323 covers the third insulating layer 321 and the semiconductor layer 322. The first gate layer 324 is located on the side of the first gate insulating layer 323 away from the base substrate 1. The second gate insulating layer 325 covers the first gate layer 324 and the first gate insulating layer 323. The second gate layer 326 is located on the side of the first gate insulating layer 323 away from the base substrate 1. The interlayer dielectric layer 327 covers the second gate layer 326 and the second gate insulating layer 325. The first source and drain metal layer 328 is located on the side of the interlayer dielectric layer 327 away from the base substrate 1. The first source and drain metal layer 328 includes a source 3281, a drain 3282 and a signal wiring 3283. The signal wiring 3283 is electrically connected to the metal wiring layer 30 through a fourth via 3284 passing through the interlayer dielectric layer 327, the second gate insulating layer 325, the first gate insulating layer 323 and the third insulating layer 321. The fourth via 3284 is communicated with the third via 311. The first planarization layer 329 covers the interlayer dielectric layer 327 and the first source and drain metal layer 328.

Specifically, the semiconductor layer 322 includes a channel region, and a source region and a drain region located on two sides of the channel region. The source 3281 is electrically connected to the source region through a source contact of the first gate insulating layer 323 passing through the interlayer dielectric layer 327 and the second gate insulating layer 325. The drain 3282 is electrically connected to the drain region through a drain contact of the first gate insulating layer 323 passing through the interlayer dielectric layer 327 and the second gate insulating layer 325.

Specifically, the signal wiring 3283 includes functional signal lines such as a data line, a scanning line, a driving voltage line and a voltage transmission line, which are used to transmit data signals, scanning signals, driving voltage signals and voltage transmission signals respectively. For example, when the signal wiring 3283 is a data line, it is used to transmit a data signal to the LED chip 20 through the metal wiring layer 30.

It should be noted that the structure of a single thin film transistor in the driving function layer 32 is not limited to a double-gate structure provided by an embodiment of this application. Those skilled in the art can also choose other structural forms, such as a single-gate structure, which will not be repetitively described here.

Further, in order to reduce voltage drop, the driving function layer 32 may also adopt a double-layer source and drain metal layer design. Specifically, the driving function layer 32 further includes a second source and drain metal layer 3210 and a second planarization layer 3211. The second source and drain metal layer 3210 is located on the side of the first planarization layer 329 away from the base substrate 1. The second source and drain metal layer 3210 is electrically connected to the drain 3282 through a via passing through the first planarization layer 329. The second planarization layer 3211 covers the first planarization layer 329 and the second source and drain metal layer 3210.

In this embodiment of this application, a fourth insulating layer 4 is further disposed between the base substrate 1 and the micro-light emitting device layer 2, for preventing the failure of the light emitting module 201 caused by external water vapor invading the micro-light emitting device layer 2. Of course, in other embodiments, the fourth insulating layer 4 may not be disposed.

Figure 2:
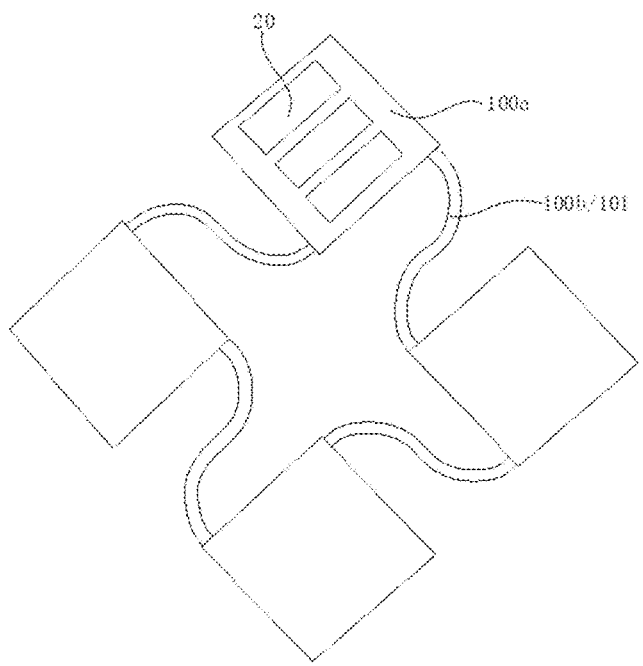
FIG. 2 illustrates a schematic diagram of connection between an island region and a hinge region of the display panel in FIG. 1.

Further, jointly referring to FIG. 1 and FIG. 2. FIG. 2 is a schematic diagram of connection between an island region and a hinge region of the display panel in FIG. 1. The display panel may be a display panel with stretchability characteristics. Specifically, the display panel includes a plurality of island regions 100*a* and a plurality of hinge regions 100*b* separated from each other. The hinge region 100*b* is located between adjacent two island regions 100*a* for connecting the adjacent two island regions 100a. The plurality of LED chips is located in the corresponding island regions 100a respectively.

It can be understood that the island region 100a is used to realize display, and the hinge region 100b is used to realize ductile deformation. When the display panel is folded, compressed or stretched under external force, the hinge region 100b generates ductile deformation in different directions in a plane under the action of tensile force in each direction, a gap between the adjacent island regions 100a will change accordingly, and the island regions 100a will rotate in a follow-up manner, so as to realize the stretchability characteristics. When the external force disappears, the hinge region 100b will automatically return to an original state, and the display panel will return to an original state.

Further, a fifth via 3285 is disposed in the hinge region 100b, and the fifth via 3285 passes through the driving function layer 32. In this embodiment of this application, the fifth via 3285 passes through the interlayer dielectric layer 327, the second gate insulating layer 325, the first gate insulating layer 323 and the third insulating layer 321. An organic filling layer 3212 is disposed in the fifth via 3285. The organic filling layer 3212 functions to improve flexibility, reduce bending stress and avoid the fracture of the signal line 3283 when the hinge region 100b is bent.

Further, a sixth via 32101 is further disposed in the hinge region 100b, and the sixth via 32101 passes through the thin film transistor array layer 3 and the micro-light emitting device layer 2, so as to make the hinge region 100b stretchable. In this embodiment of this application, the sixth via 32101 exposes a surface of the side of the base substrate 1 close to the micro-light emitting device layer 2, and the sixth via 32101 passes through the interlayer dielectric layer 327, the second gate insulating layer 325, the first gate insulating layer 323, the third insulating layer 321, the second insulating layer 31 and the first insulating layer 21.

Further, a connection wiring part 101 is disposed in the hinge region 100b and the connection wiring part 101 extends from the island region 100a to the hinge region 100b through the first source and drain metal layer 328. When the driving function layer 32 can also adopt a double-layer source and drain metal layer design, the connection wiring part 101 extends from the island region 100a to the hinge region 100b through the first source and drain metal layer 328 and the second source and drain metal layer 3210.

Further, the display panel further includes a stretchable board 5, the stretchable board 5 is disposed on the side of the thin film transistor array layer 3 away from the base substrate 1, and/or the stretchable board 5 is disposed on the side of the micro-light emitting device layer 2 close to the base substrate 1. It can be understood that the stretchable board 5 has stretchability, thus further improving the overall stretchability of the display panel.

Figure 3:
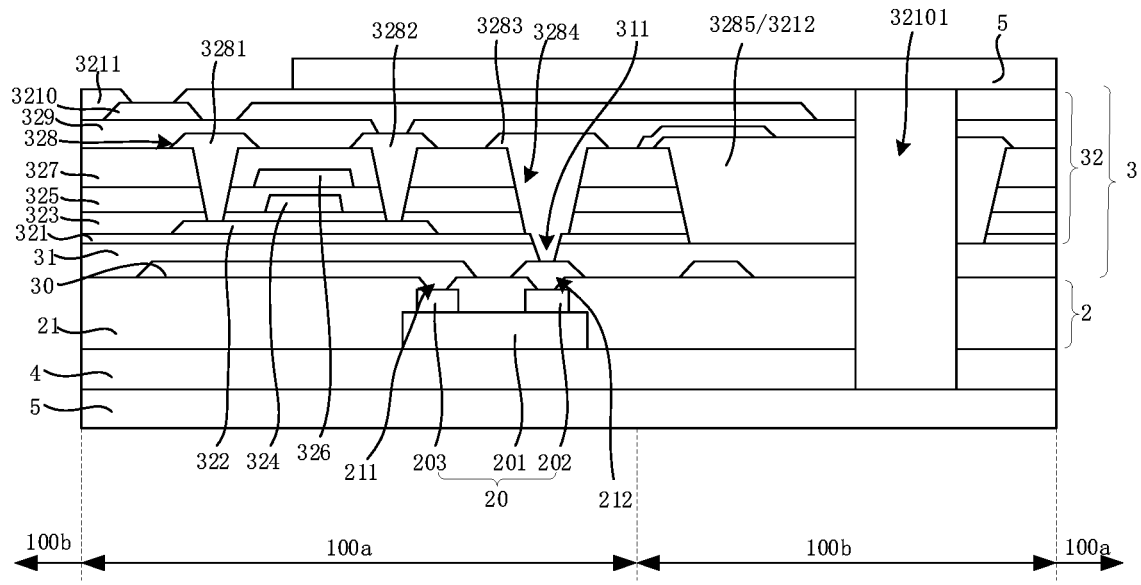
FIG. 3 illustrates a schematic sectional structural diagram of another display panel provided by an embodiment of this application.

Further, referring to FIG. 3. FIG. 3 is a schematic sectional structural diagram of another display panel provided by an embodiment of this application. The stretchable board 5 can also play a role of protecting the display panel. When the stretchable board 5 is disposed on the side of the micro-light emitting device layer 2 away from the thin film transistor array layer 3, the stretchable board 5 can replace the base substrate 1. That is, the base substrate 1 can be peeled off after the stretchable board 5 is attached to the display panel, thus helping to reduce a thickness of the display panel and further improving the flexibility of the display panel.

Optionally, a material of the stretchable board 5 includes a material with stretchability such as polydimethylsiloxane (PDMS).

Figure 4:
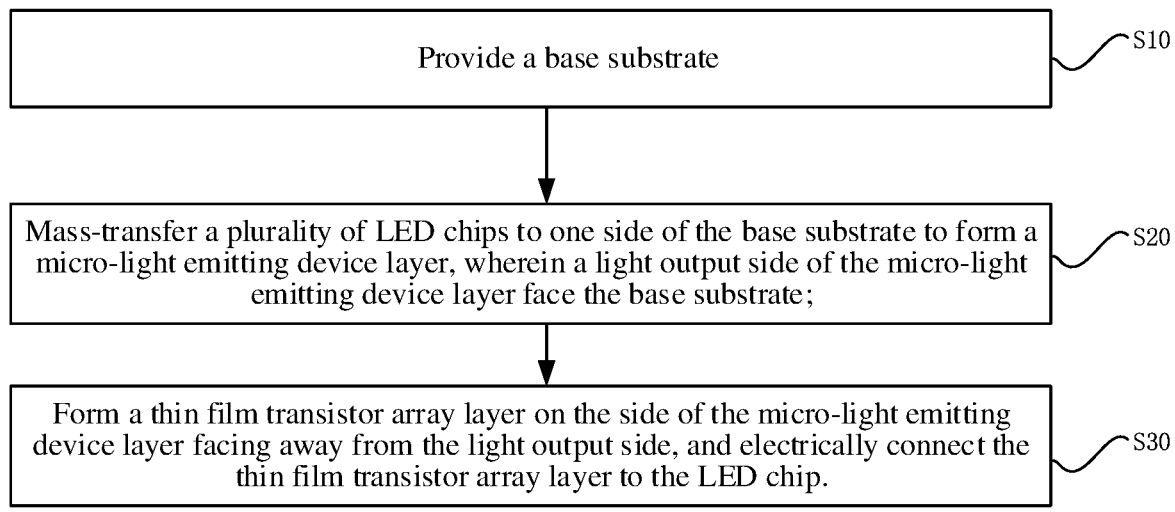
FIG. 4 illustrates a flowchart of a method for fabricating a display panel provided by an embodiment of this application.

Referring to FIG. 4 and FIG. 5A to FIG. 5L. FIG. 4 is a flowchart of a method for fabricating a display panel provided by an embodiment of this application. FIG. 5A to FIG. 5L are schematic structural diagrams of fabrication of a display panel provided by an embodiment of this application. The embodiment of this application further provides a method for fabricating a display panel. The method includes the following steps:

S10: Provide a base substrate 1.

S20: Mass-transfer a plurality of LED chips 20 to one side of the base substrate 1 to form a micro-light emitting device layer 2, wherein a light output side of the micro-light emitting device layer 2 faces the base substrate 1.

S30: Form a thin film transistor array layer 3 on the side of the micro-light emitting device layer 2 facing away from the light output side, and electrically connect the thin film transistor array layer 3 to the LED chips 20.

Figure 5A:
FIG. 5A to FIG. 5L illustrate schematic structural diagrams of fabrication of a display panel provided by an embodiment of this application.

Specifically, referring to FIG. 5A, in step S10, a base substrate 1 is provided, and a fourth insulating layer 4 is deposited on one side of the base substrate 1.

Figure 5B:
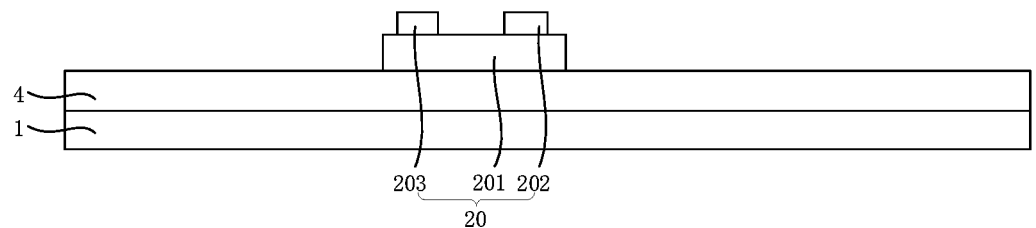

Specifically, referring to FIG. 5B, in step S20, the LED chip 20 includes a light emitting module 201, and a first electrode 202 and a second electrode 203 disposed on the side of the light emitting module 201 away from the base substrate 1. In this embodiment of this application, the first electrode 202 is a P electrode and the second electrode 203 is an N electrode.

Further, after the step of mass-transferring a plurality of LED chips 20 to one side of the base substrate 1, the method further includes the following step:

S201: Detect a plurality of the LED chips 20, determine whether there is a faulty LED chip, and if so, repair the faulty LED chip.

It can be understood that, in this application, the LED chips 20 are detected before forming the thin film transistor array layer 3. Compared with the related art, it can avoid the situation that the whole display panel is discarded as useless since the LED chips are detected after mass-transferring the LED chips 20 to the thin film transistor array layer 3 and a faulty LED chip cannot be repaired even if detected, thus greatly reducing the production cost.

Specifically, after step S201, the method further includes the following steps:

S202: Form a first insulating layer 21 covering the base substrate 1 and the LED chips 20.

S203: Form a first via 211 and a second via 212 passing through the first insulating layer 21.

Figure 5C:
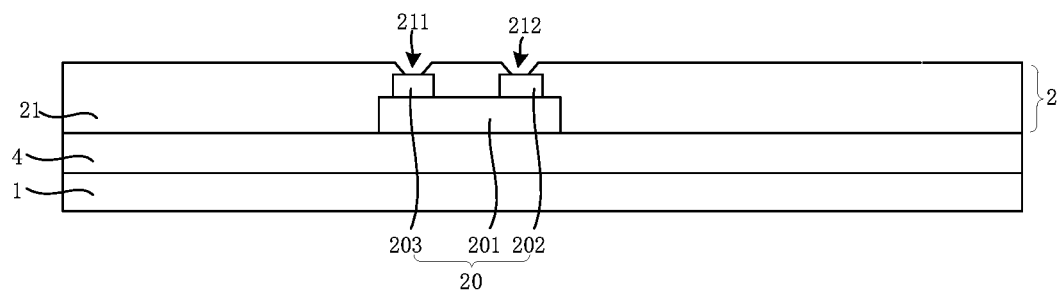

Specifically, referring to FIG. 5C, a yellow light process is adopted for the first insulating layer 21 to form the first via 211 and the second via 212. The first via 211 exposes a surface of the side of the first electrode away from the light emitting module. The second via 212 exposes a surface of the side of the second electrode 203 away from the light emitting module 201.

Specifically, step S30 includes the following steps:

S301: Form a metal wiring layer 30 on the side of the first insulating layer 21 away from the base substrate 1.

Figure 5D:
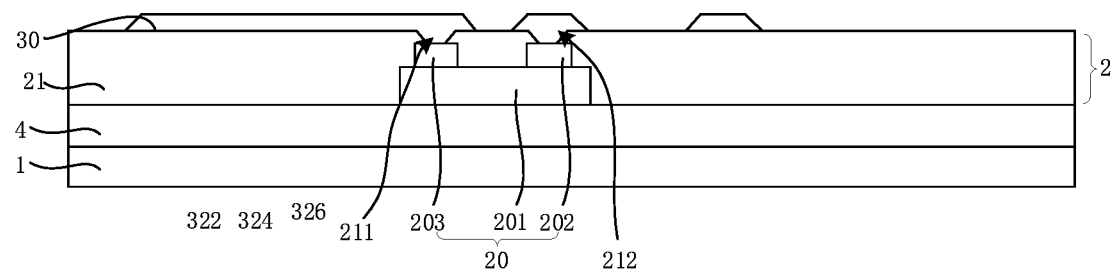

Specifically, referring to FIG. 5D, the metal wiring layer 30 may be formed on the side of the first insulating layer 21 away from the base substrate 1 by adopting a yellow light process. The metal wiring layer 30 includes an anode wiring and a low potential power signal line disposed at an interval. The anode wiring is electrically connected to the first electrode 202 through the first via 211. The low potential power signal line is electrically connected to the second electrode 203 through the second via 212.

S302: Form a second insulating layer 31 covering the first insulating layer 21 and the metal wiring layer 30.

Figure 5E:
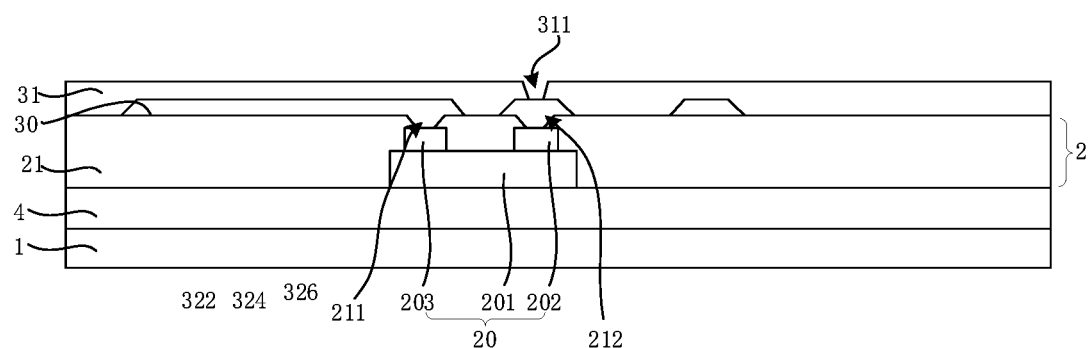

Specifically, referring to FIG. 5E, the second insulating layer 31 can be formed through a deposition process, and a material of the second insulating layer 31 may be an organic material for planarizing the metal wiring layer 30; and then, the second insulating layer 31 can be patterned through a yellow light process to form a third via 311.

S303: Form a driving function layer on the side of the second insulating layer 31 away from the base substrate 1.

Specifically, step S303 includes the following steps:

S3031: Form a third insulating layer 321 on the side of the second insulating layer 31 away from the base substrate 1.

S3032: Form a semiconductor layer 322 on the side of the third insulating layer 321 away from the base substrate 1.

S3033: Form a first gate insulating layer 323 covering the third insulating layer 321 and the semiconductor layer 322.

S3034: Form a first gate layer 324 on the side of the first gate insulating layer 323 away from the base substrate 1.

S3035: Form a second gate insulating layer 325 covering the first gate layer 324 and the first gate insulating layer 323.

S3036: Form a second gate layer 326 on the side of the first gate insulating layer 323 away from the base substrate 1;

S3037: Form an interlayer dielectric layer 327 covering the second gate layer 326 and the second gate insulating layer 325.

S3038: Form a first source and drain metal layer 328 on the side of the interlayer dielectric layer 327 away from the base substrate 1, and pattern the first source and drain metal layer 328 to form a source 3281, a drain 3282 and a signal wiring 3283.

S3039: Form a first planarization layer 329 covering the interlayer dielectric layer 327 and the first source and drain metal layer 328.

Figure 5F:
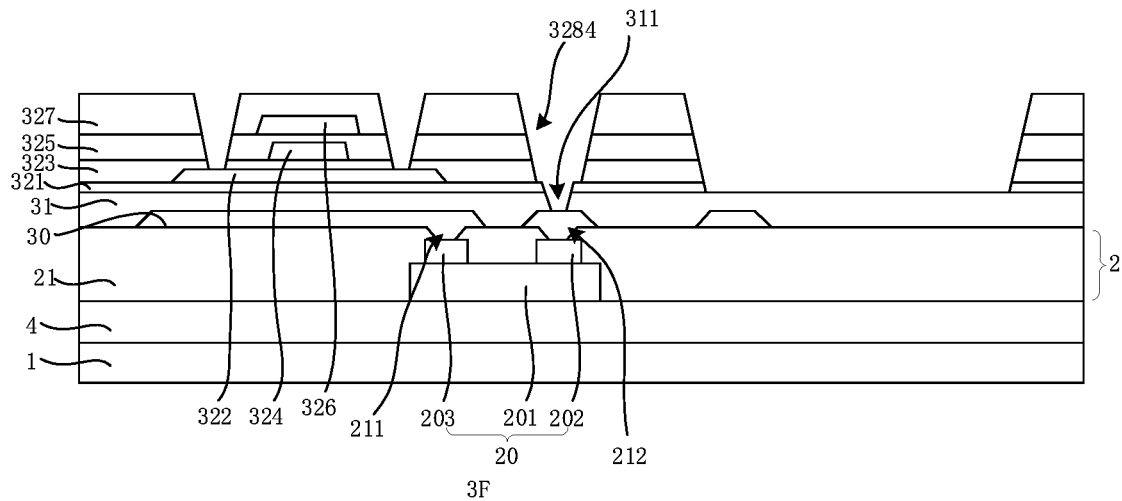

Specifically, referring to FIG. 5F, after step S3037, a source contact, a drain contact, a fourth via 3284 and a fifth via 3285 can be formed through a yellow light process. The source 3281 is electrically connected to the source region of the semiconductor layer 322 through the source contact. The drain 3282 is electrically connected to the drain region of the semiconductor layer 322 through the drain contact. The fourth via 3284 passes through the interlayer dielectric layer 327, the second gate insulating layer 325, the first gate insulating layer 323 and the third insulating layer 321. The fourth via 3284 is communicated with the third via 311. The fifth via 3285 passes through the interlayer dielectric layer 327, the second gate insulating layer 325, the first gate insulating layer 323 and the third insulating layer 321.

Figure 5G:
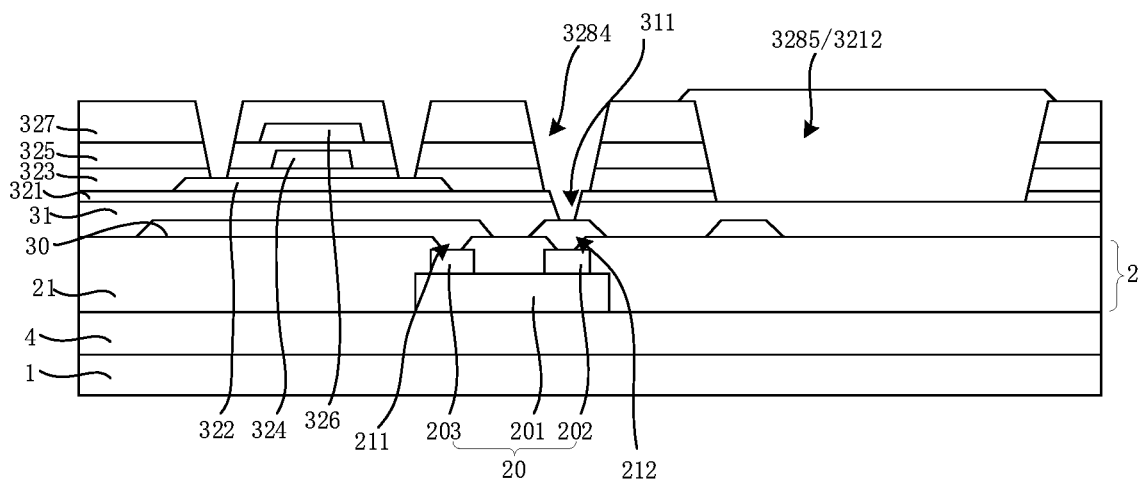

Referring to FIG. 5G, after the fifth via 3285 is formed, an organic filling layer 3212 is filled into the fifth via 3285, and a material of the organic filling layer 3212 is an organic material.

Figure 5H:
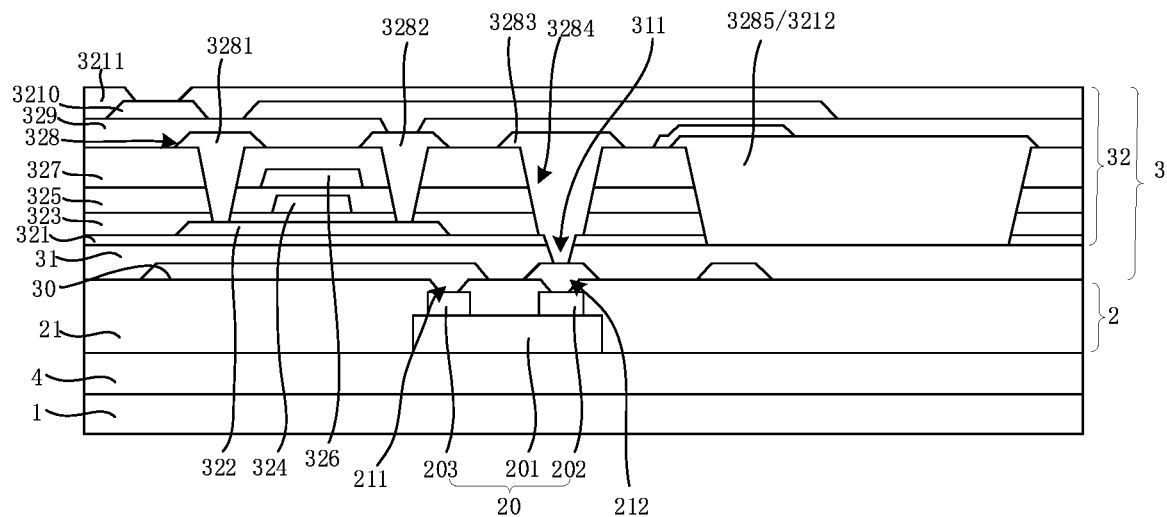

Further, referring to FIG. 5H, after step S3039, the method further includes: forming a second source and drain metal layer 3210 on the side of the first planarization layer 329 away from the base substrate 1, wherein the second source and drain metal layer 3210 is electrically connected to the drain 3282 through a via passing through the first planarization layer 329; and forming a second planarization layer 3211 covering the first planarization layer 329 and the second source and drain metal layer 3210.

Further, after step S3039, a sixth via 32101 passing through the interlayer dielectric layer 327, the second gate insulating layer 325, the first gate insulating layer 323, the third insulating layer 321, the second insulating layer 31 and the first insulating layer 21 can be formed in the hinge region 100b through a yellow light process.

Further, after step S30, the method for fabricating the display panel further includes the following step:

S40: Attach a stretchable board 5 to the side of the thin film transistor array layer 3 away from the base substrate 1 and/or the side of the micro-light emitting device layer 2 away from the thin film transistor array layer 3.

Figure 5I:
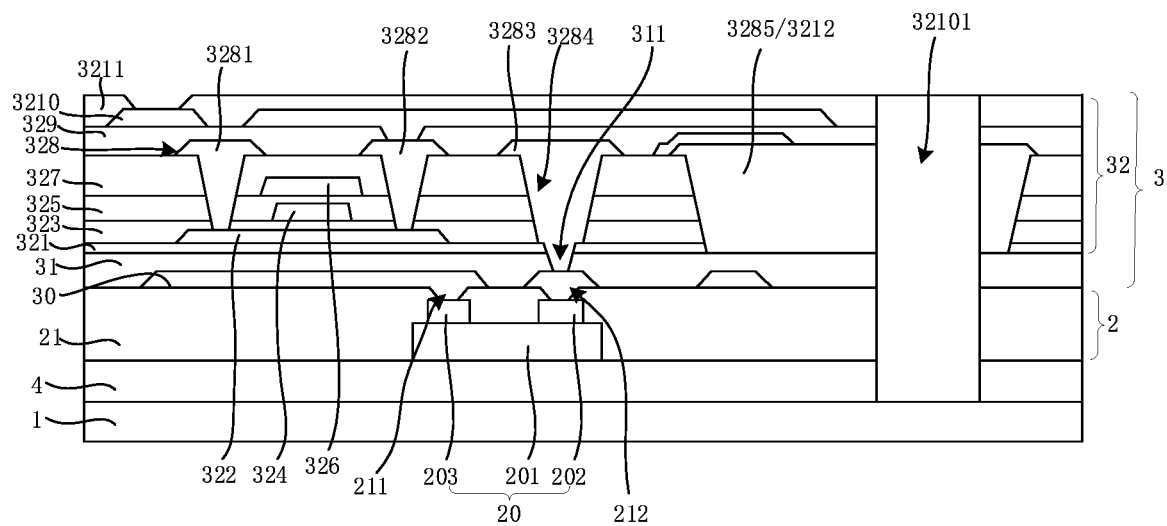

Specifically, in one embodiment, referring to FIG. 5I, the stretchable board 5 is attached to the side of the thin film transistor array layer 3 away from the base substrate 1.

Figure 5J:
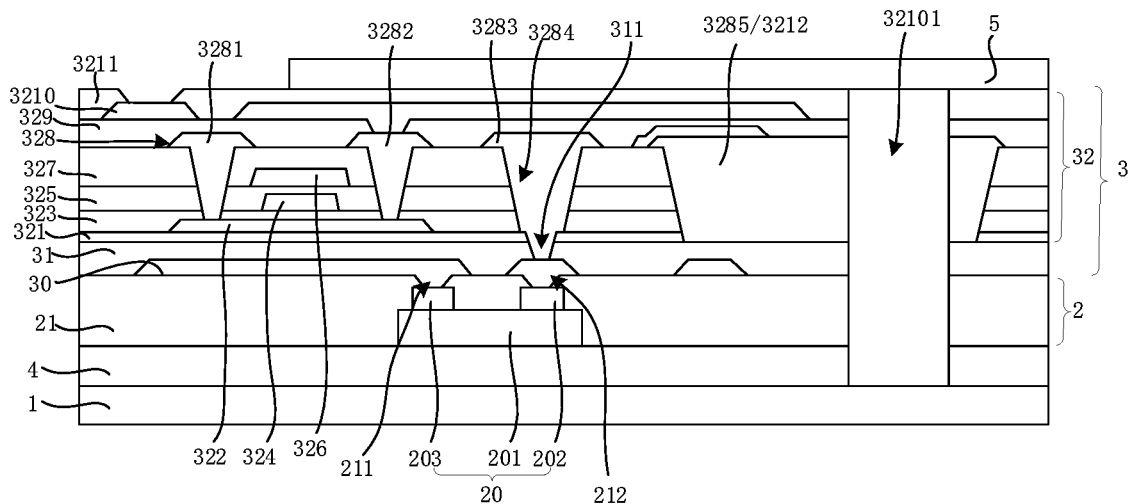
Figure 5K:
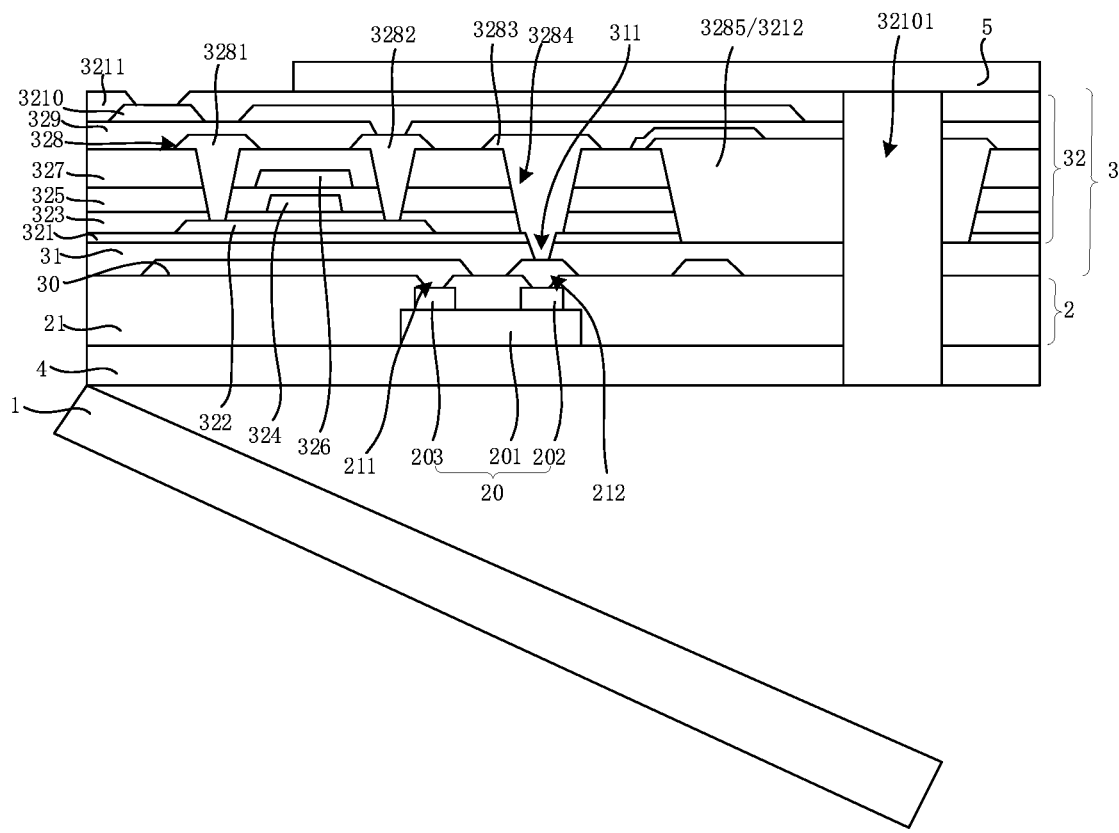
Figure 5L:
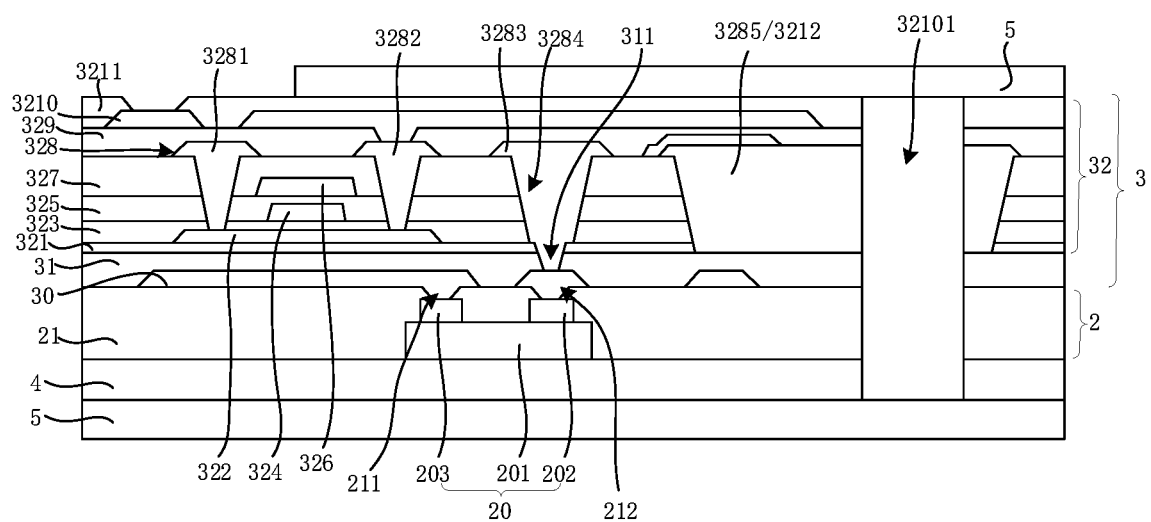

In one embodiment, referring to FIG. 5J, the base substrate 1 is peeled off; referring to FIG. 5K, the stretchable board 5 is attached to the side of the micro-light emitting device layer 2 away from the thin film transistor array layer 3.

This application has the following beneficial effects: by forming the thin film transistor array layer on the side of the micro-light emitting device layer facing away from the light output side after mass-transferring the LED chips in the micro-light emitting device layer to the base substrate, compared with the related art, since the thin film transistor array layer is directly formed on the LED chips after mass transfer of the LED chips, the LED chips do not need to be bound and connected to the thin film transistor array layer through an anisotropic conductive adhesive binding process or a metal binding process, thus making the LED chips be firmly bonded to the thin film transistor array layer, which is beneficial to improving the stability and yield of the LED chips, and reducing the process difficulty.

In summary, the present application has been disclosed through preferred embodiments; however, the preferred embodiments are not intended to limit the present application, and a person of ordinary skill in the art can make various modifications and improvements without departing from the spirit and scope of the present application; therefore, the protection scope of the present application should be subject to the scope defined by the claims.

What is claimed is:

1. A display panel, comprising:
a base substrate, wherein the base substrate is a glass substrate or a transparent polyimide substrate;
a micro-light emitting device layer, disposed on one side of the base substrate, wherein a light output side of the micro-light emitting device layer faces the base substrate; and
a thin film transistor array layer, disposed on the side of the micro-light emitting device layer facing away from the light output side;
wherein the micro-light emitting device layer comprises a plurality of light emitting diode (LED) chips, and the thin film transistor array layer is electrically connected to the LED chips to drive the LED chips to emit light;
wherein the display panel further comprises a plurality of island regions and a plurality of hinge regions separated from each other, each hinge region is located between adjacent two island regions for connecting the adjacent two island regions, and each LED chip is located in the corresponding island region; a sixth via is disposed in the hinge region, and the sixth via passes through the thin film transistor array layer and the micro-light emitting device layer;

wherein the LED chip comprises a light emitting module, and a first electrode and a second electrode disposed on the side of the light emitting module away from the base substrate;

wherein the micro-light emitting device layer further comprises a first insulating layer, the first insulating layer covers the base substrate and the LED chips, the thin film transistor array layer is electrically connected to the first electrode through a first via passing through the first insulating layer, and the thin film transistor array layer is electrically connected to the second electrode through a second via passing through the first insulating layer;

wherein the thin film transistor array layer comprises:
a metal wiring layer, located on the side of the first insulating layer away from the base substrate, wherein the metal wiring layer is electrically connected to the first electrode through the first via, and the metal wiring layer is electrically connected to the second electrode through the second via;
a second insulating layer, covering the first insulating layer and the metal wiring layer; and
a driving function layer, located on the side of the second insulating layer away from the base substrate, wherein the driving function layer is electrically connected to the metal wiring layer through a third via passing through the second insulating layer;

wherein the driving function layer comprises:
a third insulating layer, located on the side of the second insulating layer away from the base substrate;
a semiconductor layer, located on the side of the third insulating layer away from the base substrate;
a first gate insulating layer, covering the third insulating layer and the semiconductor layer;
a first gate layer, located on the side of the first gate insulating layer away from the base substrate;
a second gate insulating layer, covering the first gate layer and the first gate insulating layer;
a second gate layer, located on the side of the first gate insulating layer away from the base substrate;
an interlayer dielectric layer, covering the second gate layer and the second gate insulating layer;
a first source and drain metal layer, located on the side of the interlayer dielectric layer away from the base substrate, wherein the first source and drain metal layer comprise a source, a drain and a signal wiring, and the signal wiring is electrically connected to the metal wiring layer through a fourth via passing through the interlayer dielectric layer, the second gate insulating layer, the first gate insulating layer and the third insulating layer, the fourth via is communicated with the third via; and
a first planarization layer, covering the interlayer dielectric layer and the first source and drain metal layer; and
wherein the sixth via exposes a surface of the side of the base substrate close to the micro-light emitting device layer, and the sixth via passes through the interlayer dielectric layer, the second gate insulating layer, the first gate insulating layer, the third insulating layer, the second insulating layer and the first insulating layer.

2. The display panel according to claim 1, wherein a connection wiring part is disposed in the hinge region and the connection wiring part extends from the island region to the hinge region through the first source and drain metal layer.

3. The display panel according to claim 1, further comprising a stretchable board, wherein the stretchable board is disposed on the side of the thin film transistor array layer away from the base substrate, or the stretchable board is disposed on the side of the micro-light emitting device layer away from the thin film transistor array layer.

4. The display panel according to claim 3, wherein a material of the stretchable board comprises polydimethylsiloxane (PDMS).

5. A display panel, comprising:
a base substrate;
a micro-light emitting device layer, disposed on one side of the base substrate, wherein a light output side of the micro-light emitting device layer faces the base substrate; and
a thin film transistor array layer, disposed on the side of the micro-light emitting device layer facing away from the light output side;
wherein the micro-light emitting device layer comprises a plurality of light emitting diode (LED) chips, and the thin film transistor array layer is electrically connected to the LED chips to drive the LED chips to emit light;
wherein the display panel further comprises a plurality of island regions and a plurality of hinge regions separated from each other, each hinge region is located between adjacent two island regions for connecting the adjacent two island regions, and each LED chip is located in the corresponding island region; a sixth via is disposed in the hinge region, and the sixth via passes through the thin film transistor array layer and the micro-light emitting device layer;
wherein the LED chip comprises a light emitting module, and a first electrode and a second electrode disposed on the side of the light emitting module away from the base substrate;
wherein the micro-light emitting device layer further comprises a first insulating layer, the first insulating layer covers the base substrate and the LED chips, the thin film transistor array layer is electrically connected to the first electrode through a first via passing through the first insulating layer, and the thin film transistor array layer is electrically connected to the second electrode through a second via passing through the first insulating layer;
wherein the thin film transistor array layer comprises:
a metal wiring layer, located on the side of the first insulating layer away from the base substrate, wherein the metal wiring layer is electrically connected to the first electrode through the first via, and the metal wiring layer is electrically connected to the second electrode through the second via;
a second insulating layer, covering the first insulating layer and the metal wiring layer; and
a driving function layer, located on the side of the second insulating layer away from the base substrate, wherein the driving function layer is electrically connected to the metal wiring layer through a third via passing through the second insulating layer;
wherein the driving function layer comprises:
a third insulating layer, located on the side of the second insulating layer away from the base substrate;
a semiconductor layer, located on the side of the third insulating layer away from the base substrate;

a first gate insulating layer, covering the third insulating layer and the semiconductor layer;
a first gate layer, located on the side of the first gate insulating layer away from the base substrate;
a second gate insulating layer, covering the first gate layer and the first gate insulating layer;
a second gate layer, located on the side of the first gate insulating layer away from the base substrate;
an interlayer dielectric layer, covering the second gate layer and the second gate insulating layer;
a first source and drain metal layer, located on the side of the interlayer dielectric layer away from the base substrate, wherein the first source and drain metal layer comprise a source, a drain and a signal wiring, and the signal wiring is electrically connected to the metal wiring layer through a fourth via passing through the interlayer dielectric layer, the second gate insulating layer, the first gate insulating layer and the third insulating layer, the fourth via is communicated with the third via; and
a first planarization layer, covering the interlayer dielectric layer and the first source and drain metal layer; and
wherein the sixth via exposes a surface of the side of the base substrate close to the micro-light emitting device layer, and the sixth via passes through the interlayer dielectric layer, the second gate insulating layer, the first gate insulating layer, the third insulating layer, the second insulating layer and the first insulating layer.

6. The display panel according to claim 5, wherein a connection wiring part is disposed in the hinge region and the connection wiring part extends from the island region to the hinge region through the first source and drain metal layer.

7. The display panel according to claim 5, further comprising a stretchable board, wherein the stretchable board is disposed on the side of the thin film transistor array layer away from the base substrate, or the stretchable board is disposed on the side of the micro-light emitting device layer away from the thin film transistor array layer.

8. The display panel according to claim 7, wherein a material of the stretchable board comprises polydimethylsiloxane (PDMS).

9. A method for fabricating a display panel, comprising following steps:
providing a base substrate;
mass-transferring a plurality of light emitting diode (LED) chips to one side of the base substrate to form a micro-light emitting device layer, wherein a light output side of the micro-light emitting device layer faces the base substrate; and
forming a thin film transistor array layer on the side of the micro-light emitting device layer facing away from the light output side, and electrically connecting the thin film transistor array layer to the LED chips;
wherein the display panel further comprises a plurality of island regions and a plurality of hinge regions separated from each other, each hinge region is located between adjacent two island regions for connecting the adjacent two island regions, and each LED chip is located in the corresponding island region; a sixth via is disposed in the hinge region, and the sixth via passes through the thin film transistor array layer and the micro-light emitting device layer;
wherein the LED chip comprises a light emitting module, and a first electrode and a second electrode disposed on the side of the light emitting module away from the base substrate;
wherein the micro-light emitting device layer further comprises a first insulating layer, the first insulating layer covers the base substrate and the LED chips, the thin film transistor array layer is electrically connected to the first electrode through a first via passing through the first insulating layer, and the thin film transistor array layer is electrically connected to the second electrode through a second via passing through the first insulating layer;
wherein the thin film transistor array layer comprises:
a metal wiring layer, located on the side of the first insulating layer away from the base substrate, wherein the metal wiring layer is electrically connected to the first electrode through the first via, and the metal wiring layer is electrically connected to the second electrode through the second via;
a second insulating layer, covering the first insulating layer and the metal wiring layer; and
a driving function layer, located on the side of the second insulating layer away from the base substrate, wherein the driving function layer is electrically connected to the metal wiring layer through a third via passing through the second insulating layer;
wherein the driving function layer comprises:
a third insulating layer, located on the side of the second insulating layer away from the base substrate;
a semiconductor layer, located on the side of the third insulating layer away from the base substrate;
a first gate insulating layer, covering the third insulating layer and the semiconductor layer;
a first gate layer, located on the side of the first gate insulating layer away from the base substrate;
a second gate insulating layer, covering the first gate layer and the first gate insulating layer:
a second gate layer, located on the side of the first gate insulating layer away from the base substrate;
an interlayer dielectric layer, covering the second gate layer and the second gate insulating layer;
a first source and drain metal layer, located on the side of the interlayer dielectric layer away from the base substrate, wherein the first source and drain metal layer comprise a source, a drain and a signal wiring, and the signal wiring is electrically connected to the metal wiring layer through a fourth via passing through the interlayer dielectric layer, the second gate insulating layer, the first gate insulating layer and the third insulating layer, the fourth via is communicated with the third via; and
a first planarization layer, covering the interlayer dielectric layer and the first source and drain metal layer; and
wherein the sixth via exposes a surface of the side of the base substrate close to the micro-light emitting device layer, and the sixth via passes through the interlayer dielectric layer, the second gate insulating layer, the first gate insulating layer, the third insulating layer, the second insulating layer and the first insulating layer.

10. The method for fabricating the display panel according to claim 9, wherein after the step of mass-transferring a plurality of LED chips to one side of the base substrate, the method further comprises following steps:
detecting the plurality of LED chips, determining whether there is a faulty LED chip, and if so, repairing the faulty LED chip.

* * * * *